United States Patent [19]

Ishimoto

[11] 4,390,797
[45] Jun. 28, 1983

[54] SEMICONDUCTOR CIRCUIT

[75] Inventor: Shoji Ishimoto, Tokyo, Japan

[73] Assignee: Nippon Electric Co., Ltd., Tokyo, Japan

[21] Appl. No.: 175,806

[22] Filed: Aug. 6, 1980

[30] Foreign Application Priority Data

Aug. 7, 1979 [JP] Japan .................. 54/100893

[51] Int. Cl.³ ............................. H03K 5/01
[52] U.S. Cl. .................. 307/264; 307/279; 307/482; 307/578
[58] Field of Search ............. 307/352, 448, 264, 453, 307/482, 573, 578, 584, 279; 365/154, 182, 222

[56] References Cited

U.S. PATENT DOCUMENTS

| 3,699,539 | 10/1972 | Spence | 307/482 |
| 4,039,860 | 8/1977 | Lambrechtse et al. | 307/279 |
| 4,181,862 | 1/1980 | Dingwall | 307/279 |
| 4,267,465 | 5/1981 | Haug et al. | 307/279 |
| 4,330,719 | 5/1982 | Nagami | 307/578 |

Primary Examiner—John Zazworsky
Attorney, Agent, or Firm—Sughrue, Mion, Zinn, Macpeak and Seas

[57] ABSTRACT

An improved logic circuit which can maintain a high level of a sampled signal on a data node without reduction in level is disclosed. The circuit comprises supply means for supplying a data node with a power supply voltage and control means responsive to a level of the data node for selectively enabling the supply means.

9 Claims, 8 Drawing Figures

SEMICONDUCTOR CIRCUIT

BACKGROUND OF THE INVENTION

The present invention relates to a semiconductor circuit employing insulated gate field effect transistors (IGFET's), and more particularly a dynamic type logic circuit which is suitable for a dynamic random access memory.

In general, in a semiconductor circuit employing IGFET's, it is necessary to hold a mode in a high impedance state which is coupled to a capacitor and an IGFET either at "0" level or at "1" level for a long period of time. However, if a leakage source is present within the node, the high impedance node cannot hold the logic information and its level decays gradually. Especially in a dynamic memory of a multi-address system, since the circuit is controlled by two external control signals called $\overline{RAS}$ (Row Address Strobe) and $\overline{CAS}$ (Column Address Strobe), if the node of the internal circuit is not refreshed for a long period of time and if it is not provided with means for holding its level, then the node will have its level lowered gradually and eventually it becomes impossible to obtain a normal response. This memory system is described in U.S. Pat. No. 3,969,706 issued to Robert James Proebsting et al.

SUMMARY OF THE INVENTION

It is an one object of the present invention to provide a logic circuit which has resolved the above-mentioned problem of level lowering of the high impedance level.

It is another object of the present invention to provide a dynamic type logic circuit which can achieve stable level holding at a node in a high impedance state.

A semiconductor circuit according to the present invention comprises a signal node, a data node, signal means for supplying the signal node with a logic signal, transfer means for operatively coupling the signal node and the data node, a power supply terminal, switching means connected between the power supply terminal and the data node, and control means responsive to a level of the data node for selectively enabling the switching means.

The present invention also provides an output circuit including a data node to which a logic signal is applied in a sampling manner, in which the improvement comprises supply means for selectively supplying the data node with a power supply voltage and control means responsive to a level of the data node for selectively enabling the supply means, whereby a level of the applied signal at the data node is maintained at the power supply voltage by the supply means when the supplied signal is near the power supply voltage.

According to the present invention, there is also provided a semiconductor circuit comprising a first node, a second node, a power supply terminal, a delay circuit having an input point receiving a signal from the first node and having a first output point, a signal which is in the opposite phase to a signal at the first node and a second output point, a signal which is in-phase with the signal at the first node, a first IGFET having a drain coupled to the first node, a gate coupled to the first output point, and a source coupled to the second node, a capacitor having one end connected to the second node and the other end coupled to the second output point, and a second IGFET having a drain coupled to the power supply terminal, a gate coupled to the second node and a source coupled to the first node, whereby a high level at the first node is maintained at the level of the power supply by the second IGFET.

BRIEF DESCRIPTION OF THE DRAWINGS

The above-mentioned and other features and objects of the present invention will become more apparent by reference to the following description of its preferred embodiment taken in conjunction with the accompanying drawings.

DESCRIPTION OF THE PREFERRED EMBODIMENTS

Throughout the following description, among the insulated gate field effect transistors, the most representative MOS transistors (hereinafter abbreviated as MOST) are employed. Especially, the description is made with respect to N-channel MOST's, and it is assumed that a high level is a logic "1" level and a low level is a logic "0" level. However, with respect to the circuit structure, the description is essentially the same even if P-channel MOST's are employed.

Figure 1:
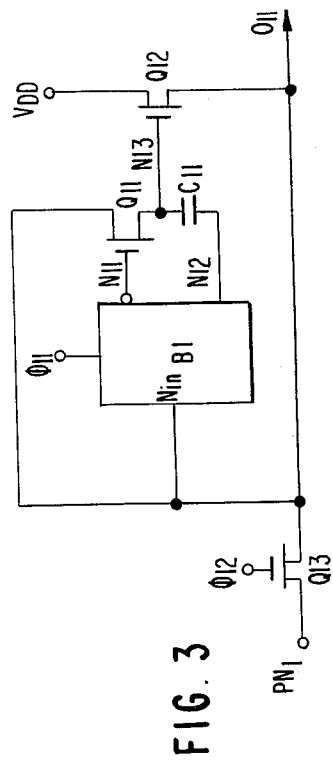
FIG. 1 is a circuit diagram showing a semiconductor circuit in the prior art.
Figure 2:
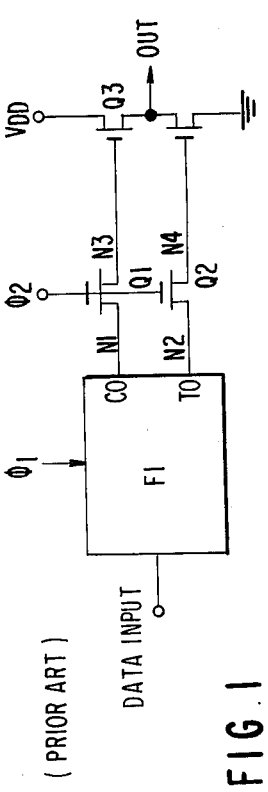
FIG. 2 is a waveform diagram showing various internal waveforms in the circuit shown in FIG. 1.

At first, by way of example, an output circuit of a dynamic RAM in the prior art will be described with reference to FIGS. 1 and 2.

In the multi-address memory system, the output level is controlled only by the $\overline{CAS}$ and it is asynchronous with the $\overline{RAS}$. However, since resetting of an internal signal generated by the $\overline{CAS}$ is effected in synchronism with the $\overline{RAS}$, a transfer gate MOST for isolation is necessitated between an output buffer and an output MOST, which correspond to DATA OUTPUT LATCH & BUFFER in the mentioned U.S. patent. In FIG. 1, a logic signal at a point DATA INPUT is latched by a flip-flop F1 in response to an activation signal $\phi_1$ for the flip-flop, and true and complement signals (CO, TO) for the logic signal appear at nodes $N_1$ and $N_2$, respectively. At the same time, in response to a change of a control signal $\phi_2$ from a "0" level to a "1" level, nodes $N_1$ and $N_3$ and nodes $N_2$ and $N_4$, respectively, are brought into a coupled state via MOST's $Q_1$ and $Q_2$, respectively, and hence a level corresponding to the logic signal at the point DATA INPUT appears at an output terminal OUT. In this case, when the $\overline{RAS}$ has changed to a reset condition, the internal information (CO, TO) at the nodes $N_1$ and $N_2$ are reset by the signal $\phi_1$ which is controlled by the $\overline{CAS}$. However, since it is necessary to hold the level at the output terminal OUT unchanged, it is necessary to provide a time difference between the resettings of the control signals $\phi_1$ and $\phi_2$ so that the logic levels at the nodes $N_3$ and $N_4$ can be retained. In the prior art, the node $N_1$ is isolated from the node $N_3$ and the node $N_2$ is isolated from the node $N_4$ with respect to an impedance by resetting (setting the "0" level) the control signal $\phi_2$ earlier than the control signal $\phi_1$, and thereby the node $N_3$ and the node $N_4$ are isolated in a high impedance state to be held at the "0" level and at the "1" level, respectively, or vice versa. In this circuit, since the node $N_3$ and the node $N_4$ are left in a high impedance state, when the levels at these nodes are changed for any reason, the capability of recovering the previous states at the nodes is not provided anywhere. With regard to the principal cause for changing the high impedance level, when the control signal $\phi_2$ changes from the "1" level to the "0" level, the levels at the node $N_3$ and at the node $N_4$ are made to fall due to the gate-source capacitances of the MOST's $Q_1$ and $Q_2$, and the magnitude of the voltage decrease is determined by the ratio of the gate-source capacitances to the capacitances at the nodes $N_3$ and $N_4$. Moreover, in the case where there exists leakage in the MOST's and stray capacitances connected to the nodes $N_3$ and $N_4$, the high impedance level will be further lowered. In a memory device employing a 5 V power supply, this problem is especially liable to occur, and the aforementioned phenomena are remarkable when the output OUT emits the "1" level, that is, when the node $N_3$ is at the "1" level. This is because when the level of the node $N_3$ which is equal to the gate level of the MOST $Q_3$ is at the "1" level, the gate level of the MOST $Q_3$ will be at the power supply $V_{DD}$ level and hence it is operating in a saturation range to produce a level ($V_{DD}$—threshold voltage of the MOST $Q_3$) at its source. Accordingly, the lowered level at the node $N_3$ cannot drive the output MOST $Q_3$ sufficiently. On the other hand, in the case where the node $N_4$ is at the "1" level and the output OUT is at the "0" level, the MOST $Q_4$ is driven in a triode region where the capability of the output has a margin, and therefore, there occurs no such problem.

Figure 3:
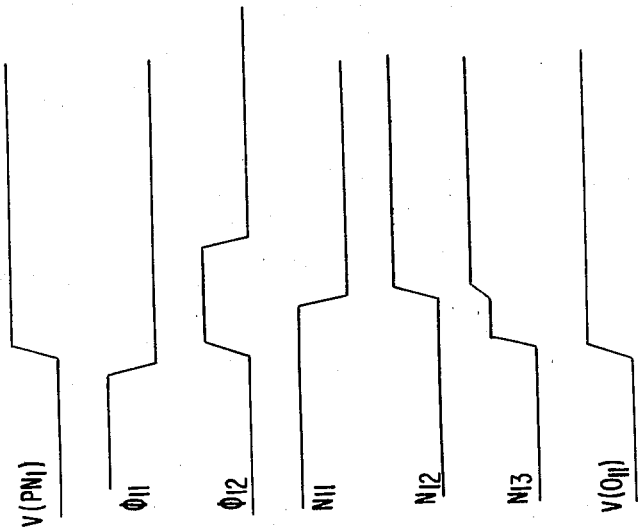
FIG. 3 is a circuit diagram showing the basic concept of the present invention.
Figure 4:
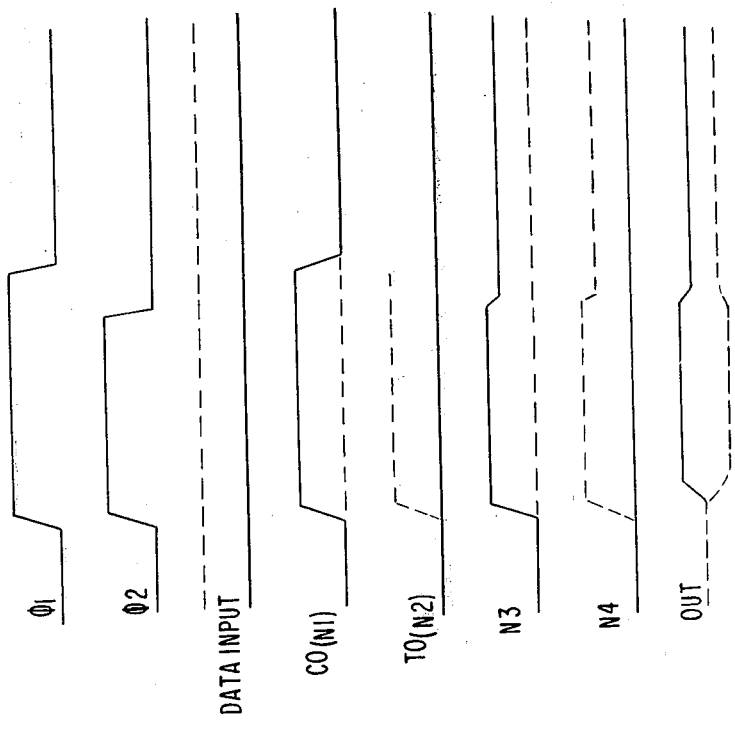
FIG. 4 is a waveform diagram showing various internal waveforms in the circuit shown in FIG. 3.

Now the basic concept of the present invention will be explained with reference to FIGS. 3 and 4.

A delay circuit B1 having an input Nin connected to a node $O_{11}$ which takes operably a high-impedance and a high-level state, is provided with two outputs, one being an output $N_{11}$ which is of opposite phase to the level at the node $O_{11}$, the other being an output $N_{12}$ which is in-phase with node $O_{11}$, and the resetting of this delay circit B1 is effected by a control signal $\phi_{11}$. The node $O_{11}$ is further connected to a drain of a MOST $Q_{11}$, whose gate is connected to the opposite phase output $N_{11}$ of the aforementioned delay circuit and whose source is connected to a gate of a second MOST $Q_{12}$ and to one end of the capacitor $C_{11}$, the other end of which is connected to the in-phase output $N_{12}$. The drain of the MOST $Q_{12}$ is connected to a power supply $V_{DD}$, and its source provides the aforementioned node $O_{11}$. The MOST $Q_{12}$ serves to hold the level at the node $O_{11}$ at a high level therethrough. The node $O_{11}$ is also coupled to an input point $PN_1$ through the MOST $Q_{13}$ which has a control signal $\phi_{12}$ applied to its gate.

The operation of this circuit will now be described with reference to FIG. 2.

In a reset condition, the control signals $\phi_{11}$ and $\phi_{12}$ are respectively at the "1" and "0" level, and the node $O_{11}$ is also at the "0" level as shown by V ($O_{11}$). The node $N_{11}$ is at the "1" level because it is of opposite phase to the node $O_{11}$, and the node $N_{12}$ is at the "0" level, and hence the node $N_{13}$ is at the "0" level. In addition, the input signal V ($PN_1$) at the node $PN_1$ is at the "0" level. Simultaneously with the rise of the input signal V ($PN_1$), the control signals $\phi_{11}$ and $\phi_{12}$ also change from the "1" level to the "0" level and from the "0" level to the "1" level, respectively, and thereby the input signal is transmitted to the node $O_{11}$ and the delay circuit B1 starts its delay operation. During this time the node $N_{13}$ is charged up through the MOST $Q_{11}$. Then, after a delay period of the delay circuit B1, the output node $N_{12}$ of the delay circuit B1 changes from the "0" level to the "1" level after completion of charging of the node $N_{13}$ and thereby raises the level at the node $N_{13}$ up to a level higher than the power supply $V_{DD}$, so that the node $O_{11}$ which serves as an output is coupled to the power supply through the MOST $Q_{12}$ in a low impedance condition. Under such a condition, besides the input signal V ($PN_1$), the node $O_{11}$ is provided with a hold circuit with respect to the power supply $V_{DD}$, and hence even if the MOST $Q_{13}$ is turned off by changing the control signal $\phi_{12}$ to the "0" level, the level V ($PN_1$) of the output $O_{11}$ can be held at the power supply level ($V_{DD}$).

Though the above description was made for the case where the signal V ($PN_1$) is changed to "1" level, the case where the signal V ($PN_1$) remains at the "0" level can be similarly understood. In this case, the level of the node $N_{11}$ and the level of the node $N_{12}$ remain at "1" and "0" levels, respectively, and hence the level of the node $N_{13}$ is kept at the "0" level so that the MOST $Q_{12}$ remains non-conducting. Thus, the "0" level is held on the node $O_{11}$.

The above-mentioned is a basic operation according to the present invention, and the operation is characterized by the following advantages:

(1) When the gate control signal $\phi_{12}$ for the MOST $Q_{13}$ has changed from the "1" level to the "0" level, since the node $O_{11}$ is coupled through a low impedance provided by the MOST $Q_{12}$ to the power supply $V_{DD}$, the lowering of the level caused by the gate-source capacitance of the MOST $Q_{13}$ can be prevented.

(2) Likewise, when the node $O_{11}$ is in a high impedance condition, if any leakage source is present, the "1" level will be lowered gradually. However, owing to existence of the MOST $Q_{12}$ the lowering of the level can be prevented.

Figure 5:
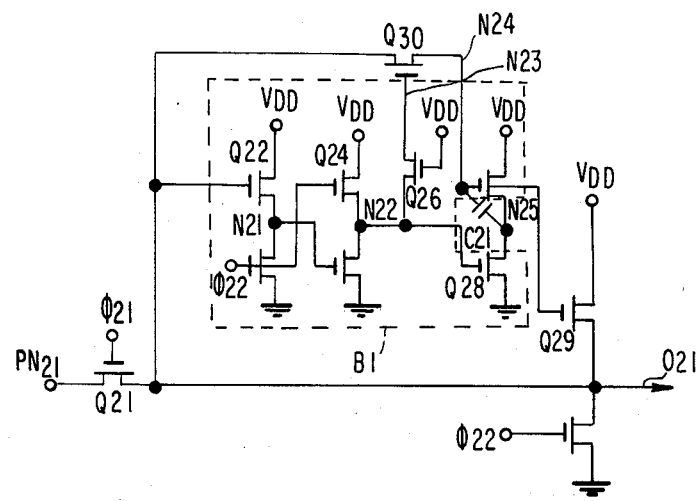
FIG. 5 is a circuit diagram showing one preferred embodiment of the present invention.
Figure 6:
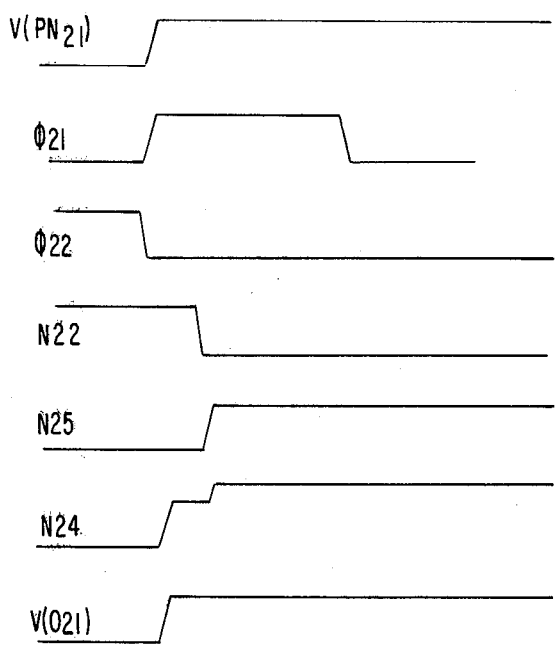
FIG. 6 is a waveform diagram showing input and output waveforms and internal node waveforms in the circuit shown in FIG. 5.

With reference to FIGS. 5 and 6, one preferred embodiment of the present invention will now be described.

An input point $PN_{21}$ is coupled to an output node $O_{21}$ through a MOST $Q_{21}$ which has a control signal $\phi_{21}$ applied to its gate, and the aforementioned output node $O_{21}$ is connected to a drain of a transfer MOST $Q_{30}$ which drives a MOST $Q_{29}$ for holding the level of the output node $O_{21}$ in a low impedance condition, and to a gate of a MOST $Q_{22}$ which serves as a trigger for a delay circuit composed of MOST's $Q_{22}$, $Q_{23}$, $Q_{24}$ and $Q_{25}$. Also the output of this delay circuit serves to drive a bootstrap circuit consisting of MOST's $Q_{27}$ and $Q_{28}$ and a bootstrap capacitor $C_{21}$, and simultaneously to turn off a MOST $Q_{30}$ through a MOST $Q_{26}$ after activation of the output node $O_{21}$.

With reference to FIG. 6, the operation will now be described. In a reset condition, a control signal $\phi_{22}$ is at the "1" level, the nodes $N_{21}$, $N_{24}$, $N_{25}$ and $O_{21}$ are at the "0" level, and the nodes $N_{22}$ and $N_{23}$ are at the "1" level. In response to the change of the control signal $\phi_{22}$ from the "1" level to the "0" level and the change of the control signal $\phi_{21}$ from the "0" level to the "1" level, the output node $O_{21}$ is coupled to the input point $PN_{21}$ through a MOST $Q_{21}$, and thereafter when the input signal V ($PN_{21}$) at the point $PN_{21}$ changes from the "0" level to the "1" level, the response of this circuit commences. The output node $O_{21}$ is charged up through the MOST $Q_{21}$ and thus takes the "1" level. At the same time, the node $N_{24}$ connected to the gates of the MOST's $Q_{27}$ and $Q_{29}$ is charged up through the MOST $Q_{30}$. A node $N_{22}$ forming the output of the delay circuit changes from the "1" level to the "0" level after a predetermined period. Accordingly, the node $N_{25}$ is changed to the "1" level, so that the node $N_{24}$ is raised to a potential higher than the power supply $V_{DD}$ due to a bootstrap effect, and thus the output node $O_{21}$ is held at the power supply level $V_{DD}$ by the MOST $Q_{29}$. After completion of the above-mentioned operation, even when the control signal $\phi_{21}$ changes to the "0" level and the MOST $Q_{21}$ takes the OFF condition, the output node $O_{21}$ would not take a high impedance condition but is coupled to the power supply under a low impedance condition through the MOST $Q_{29}$.

Figure 7:
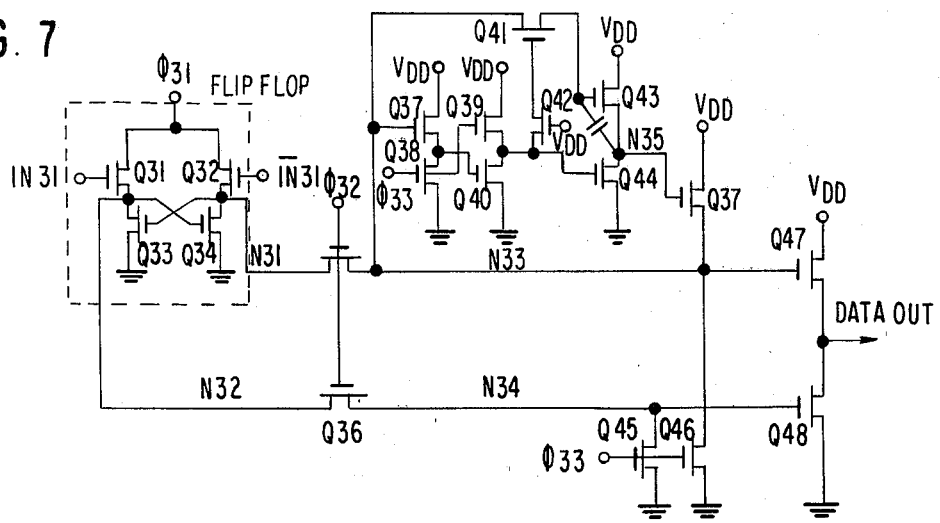
FIG. 7 is a circuit diagram showing another preferred embodiment of the present invention.

In FIG. 7 is shown another preferred embodiment of the present invention. The illustrated embodiment relates to the case where the present invention is applied to an output circuit for a memory employing a multi-address system. In the case of the multi-address system, the circuit is constructed in such manner that it is controlled by two external control signals called $\overline{RAS}$ and $\overline{CAS}$, respectively, and while internal control signals produced by the $\overline{RAS}$ and $\overline{CAS}$ must all be reset by the $\overline{RAS}$, the data output is controlled only by the $\overline{CAS}$. In order to realize such operations, the circuit construction is such that internal control signals $\phi_{31}$ and $\phi_{32}$ and true and complement signals $In_{31}$ and $\overline{In_{31}}$ derived from an I/O bus are controlled by both the $\overline{CAS}$ and the $\overline{RAS}$, but an internal control signal $\phi_{33}$ is controlled only by the $\overline{CAS}$.

Figure 8:
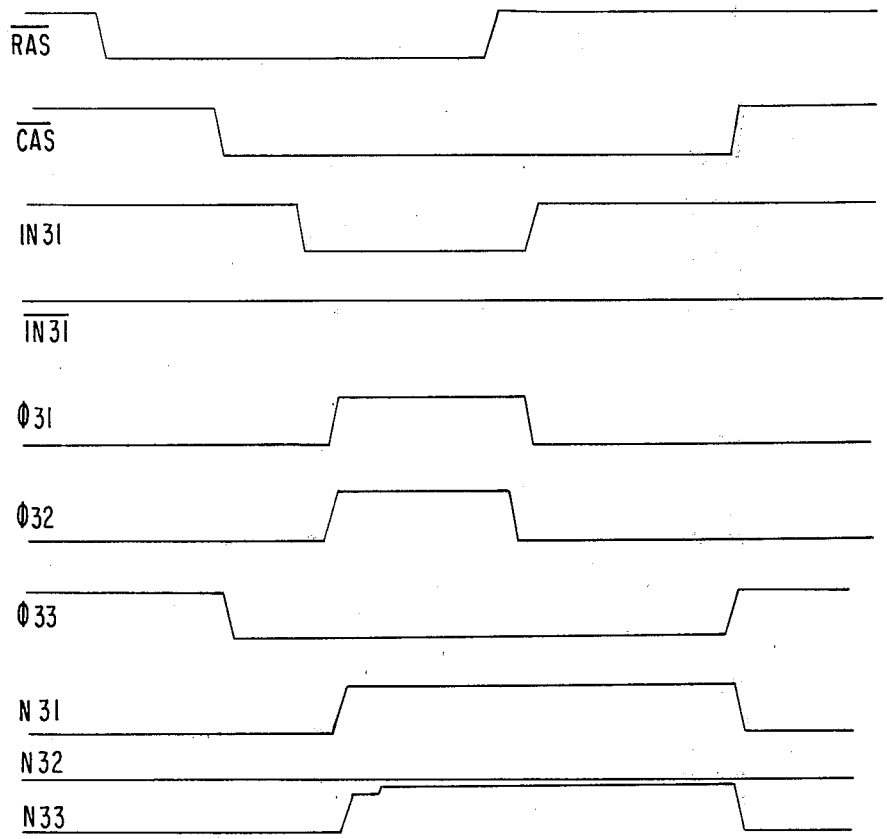
FIG. 8 is a waveform diagram showing input and output waveforms and internal node waveforms in the circuit shown in FIG. 7.

FIG. 8 shows the respective input and output waveforms and the voltage waveforms at the respective nodes, and the illustrated example relates to the case where the $\overline{RAS}$ is reset earlier than $\overline{CAS}$. In response to the change of the $\overline{RAS}$ from the "1" level which is the reset condition of the $\overline{RAS}$ to the "0" level, the memory is activated so that one word line corresponding to the row address input is selected, signals corresponding to the selected memory cells appear on the respective bit lines, and owing to activation of sense amplifiers, logic levels of either the "0" level or the "1" level can be obtained on the bit lines. Subsequently, in response to the activation of the $\overline{CAS}$, a switch between a bit line corresponding to a column address and an I/O bus is turned ON, so that the bit line information appears on the I/O bus and it is amplified by an I/O bus amplifier to the "0" or "1" level. The I/O bus true and complement signals $In_{31}$ and $\overline{In_{31}}$ in FIG. 7 correspond to this signal, and activation of the control signals $\phi_{31}$ and $\phi_{32}$ is effected after a difference signal has appeared between these I/O bus true and complement signals $In_{31}$ and $\overline{In_{31}}$. The activation timings for the control signals $\phi_{31}$ and $\phi_{32}$ are substantially the same timing, and in response to the activation of the control signal $\phi_{32}$, the nodes $N_{31}$ and $N_{32}$ are respectively coupled with a low impedance to the nodes $N_{33}$ and $N_{34}$, respectively, through the MOST's $Q_{35}$ and $Q_{36}$. In response to the activation of the control signal $\phi_{31}$, the levels of the outputs $N_{31}$ and $N_{32}$ of the flip-flop composed of MOST's $Q_{31}$, $Q_{32}$, $Q_{33}$ and $Q_{34}$ are determined so as to correspond to the I/O bus true and complement signals $In_{31}$ and $\overline{In_{31}}$. Assuming now that the I/O bus signal $In_{31}$ is at the "0" level and the other I/O bus signal $\overline{In_{31}}$ is at the "1" level, the node $N_{31}$ takes the "1" level, while the node $N_{32}$ takes the "0" level, and hence through the MOST's $Q_{35}$ and $Q_{36}$ the node $N_{33}$ is changed to the "1" level and the node $N_{34}$ is changed to the "0" level. At the same time, similarly to the above-described embodiment, the MOST $Q_{37}$ is turned ON, and thus holds the node $N_{33}$ at the power supply level $V_{DD}$. Accordingly, during the activation period of the $\overline{RAS}$, the "1" level at the node $N_{33}$ can be held by the MOST $Q_{32}$, MOST $Q_{35}$ and MOST $Q_{37}$. When the $\overline{RAS}$ is turned to a reset condition, at first the control signal $\phi_{32}$ becomes "0" and thereby isolates the nodes $N_{31}$ and $N_{32}$ from the nodes $N_{33}$ and $N_{34}$, respectively, at the MOST's $Q_{35}$ and $Q_{36}$. At this time, though it may appear that the level at the node $N_{33}$ will be lowered due to the gate-source capacitance of the MOST $Q_{35}$, the level at the node $N_{33}$ can be held by the MOST $Q_{37}$ and hence the output level would not be lowered. Thereafter the control signal $\phi_{31}$ is reset, precharge of the I/O bus ($In_{31}$ and $\overline{In_{31}}$) is effected, and thus the circuit takes a stand-by condition. However, the levels at the node $N_{33}$ and at the output DATA OUT are still held by the MOST $Q_{37}$. When the internal control signal $\phi_{33}$ becomes "1" in response to resetting of the $\overline{CAS}$, the resetting of the nodes $N_{33}$ and $N_{35}$ and the delay circuit is completed, and the output mode DATA OUT takes a high impedance condition.

As described above, by employing the circuit construction according to the present invention at a high impedance node, it is possible to prevent lowering of a high level under a high impedance condition.

I claim:

1. A semiconductor circuit comprising a first node, a second node, first means for supplying said first node with a logic signal, a first field effect transistor coupled between said first and second nodes, means for operatively making said first transistor conducting thereby to provide said second node with a signal at said first node, a power supply terminal, a second field effect transistor, means for connecting one of a source and a drain of said second transistor to said power supply terminal, means for connecting the other of the source and drain of said second transistor to said second node, a delay circuit having an input terminal coupled to said second node, a true output terminal and a complement output terminal, a third field effect transistor, means for connecting one of a source and a drain of said third transistor to said second node, means for connecting a gate of said third transistor to said complement output terminal, means for connecting the other of the source and drain of said third transistor to a gate of said second transistor, a capacitor, means for connecting one end of said capacitor to the gate of said second transistor and means for connecting the other end of said capacitor to said true output terminal.

2. The circuit according to claim 1, in which said first means includes a flip-flop circuit.

3. The circuit according to claim 1, in which said delay circuit includes a first series circuit of fourth and fifth field effect transistors, a second series circuit of sixth and seventh field effect transistors, a third series circuit of eighth and ninth field effect transistors, means for connecting a gate of said fourth transistor to said input terminal, means for supplying gates of said fifth and sixth transistors with a reset signal for initializing a state of said delay circuit, means for connecting an intermediate junction of said first series circuit to a gate of said seventh field effect transistor, means for connecting an intermediate junction of said second series circuit to a gate of said ninth transistor, means for connecting the intermediate junction of said second series circuit to said complement output terminal, and means for connecting an intermediate junction of said third series circuit to said true output terminal.

4. A semiconductor circuit comprising a first node, a second node, switching means coupled between said first node and said second node, means for operatively enabling said switching means thereby to make a level at said second node substantially equal to that at said first node, a potential terminal receiving a given potential, a first field effect transistor, means for connecting one of a source and a drain of said first transistor to said second node, means for connecting the other of the source and drain of said first transistor to said potential terminal, a third node, means for connecting a gate of said first transistor to said third node, and means for operatively raising a potential at said third node to a level having a higher absolute value than said given potential by a bootstrap effect after a level at said second node becomes a level nearly equal to said given potential.

5. The circuit according to claim 4, in which said raising means includes a second field effect transistor, means for connecting one of a drain and a source of said second transistor to said second node, means for connecting the other of the drain and source of said second transistor to a gate of said first transistor, a capacitor, means for connecting one end of said capacitor to the gate of said first transistor, a delay circuit having an input terminal coupled to said second node, a true output terminal and a complement output terminal, means for connecting a gate of said second transistor to said complement output terminal, and means for connecting the other end of said capacitor to said true output terminal.

6. The circuit according to claim 4, in which said switching means includes a third field effect transistor coupled between said first and second nodes.

7. The circuit according to claim 4, further comprising means for operatively setting a potential at said second node at a reference potential prior to conducting of said switching means.

8. A semiconductor circuit comprising a first node to which a logic signal is applied, a first terminal to which a first potential is applied to, a second terminal to which a second potential is applied, a first series circuit of first and second field effect transistors connected in series between said first and second terminals and receiving a signal from said first node, a second series circuit of third and fourth field effect transistors connected in series between said first and second terminals and receiving a signal derived from an intermediate junction of said first series circuit, a third series circuit of fifth and sixth field effect transistors connected in series between said first and second terminals and receiving a signal derived from an intermediate junction of said second series circuit, a seventh field effect transistor coupled between said first terminal and said first node, a capacitor coupled between a gate of said fifth transistor and an intermediate junction of said third series circuit, means for connecting the gate of said fifth transistor to a gate of said seventh transistor, an eighth field effect transistor, first means for connecting one of a source and a drain of said eighth transistor to said first node, second means for connecting the other of the source and drain of said eighth field effect transistor to the gate of said fifth transistor, and third means for connecting a gate of said eighth transistor to the intermediate junction of said second series circuit.

9. The circuit according to claim 8, in which said third means includes a ninth field effect transistor coupled between the gate of said eighth transistor and the intermediate junction and having a gate coupled to said first terminal.

* * * * *

UNITED STATES PATENT AND TRADEMARK OFFICE
CERTIFICATE OF CORRECTION

PATENT NO. : 4,390,797
DATED : June 28, 1983
INVENTOR(S) : Shoji Ishimoto

It is certified that error appears in the above-identified patent and that said Letters Patent is hereby corrected as shown below:

Column 1, line 11, delete "mode" and insert --node--.

Signed and Sealed this

Thirteenth Day of March 1984

[SEAL]

Attest:

GERALD J. MOSSINGHOFF

*Attesting Officer*     *Commissioner of Patents and Trademarks*